(12) United States Patent
Casebolt

(10) Patent No.: US 6,437,980 B1
(45) Date of Patent: Aug. 20, 2002

(54) LOW PROFILE HIGH DENSITY RACK MOUNTABLE ENCLOSURE WITH SUPERIOR COOLING AND HIGHLY ACCESSIBLE RE-CONFIGURABLE COMPONENTS

(75) Inventor: Matthew P. Casebolt, Fremont, CA (US)

(73) Assignee: California Digital Corporation, Fremont, CA (US)

( * ) Notice: Subject to any disclaimer, the term of this patent is extended or adjusted under 35 U.S.C. 154(b) by 0 days.

(21) Appl. No.: 09/691,467

(22) Filed: Oct. 17, 2000

(51) Int. Cl.[7] .................................................. H05K 7/20
(52) U.S. Cl. .................. 361/687; 361/707; 165/104.21; 174/15.2
(58) Field of Search .................................. 361/687, 680, 361/681, 699, 700, 704, 707; 364/708.1; 165/80.4, 104.33, 104.21; 62/259.2; 174/15.2

(56) References Cited

U.S. PATENT DOCUMENTS

| | | | | |
|---|---|---|---|---|
| 6,023,415 A | * | 2/2000 | Mayer et al. | 361/816 |
| 6,111,748 A | * | 8/2000 | Bhatia | 361/695 |
| 6,215,660 B1 | * | 4/2001 | Lin | 361/695 |
| 6,229,700 B1 | * | 5/2001 | Liu et al. | 361/687 |

* cited by examiner

Primary Examiner—Darren Schuberg
Assistant Examiner—Hung Van Duong
(74) Attorney, Agent, or Firm—Skjerven Morrill LLP; Philip W. Woo

(57) ABSTRACT

A low profile high density rack mountable enclosure with superior cooling and highly accessible re-configurable components is disclosed. One embodiment of the present invention discloses a computer system comprising a chassis for holding a plurality of computer components, a CPU having a heatsink mounted thereon, wherein the CPU is mounted in the chassis, and a first blower having an inlet for receiving air and an outlet for expelling air, wherein the first blower is mounted in the chassis proximate to the CPU. Another embodiment of the present invention discloses a retention clip for use in a computer system, the retention clip comprising a base portion having at least one tab, and a flange portion having at least one mounting hole, wherein the flange portion is connected to the base portion, and wherein the flange portion makes an angle with the base portion. Another embodiment of the present invention discloses a computer enclosure comprising a chassis having a left side, a right side, and a bottom side, wherein a rear edge of the bottom side includes an open hem, a top panel, wherein a rear edge of the top panel includes an open hem, and a rear panel having a left side, a right side, a top side, and a bottom side, wherein the open hem of the bottom side is adapted to receive the bottom side of the rear panel, and the open hem of the top panel is adapted to receive the top side of the rear panel.

31 Claims, 3 Drawing Sheets

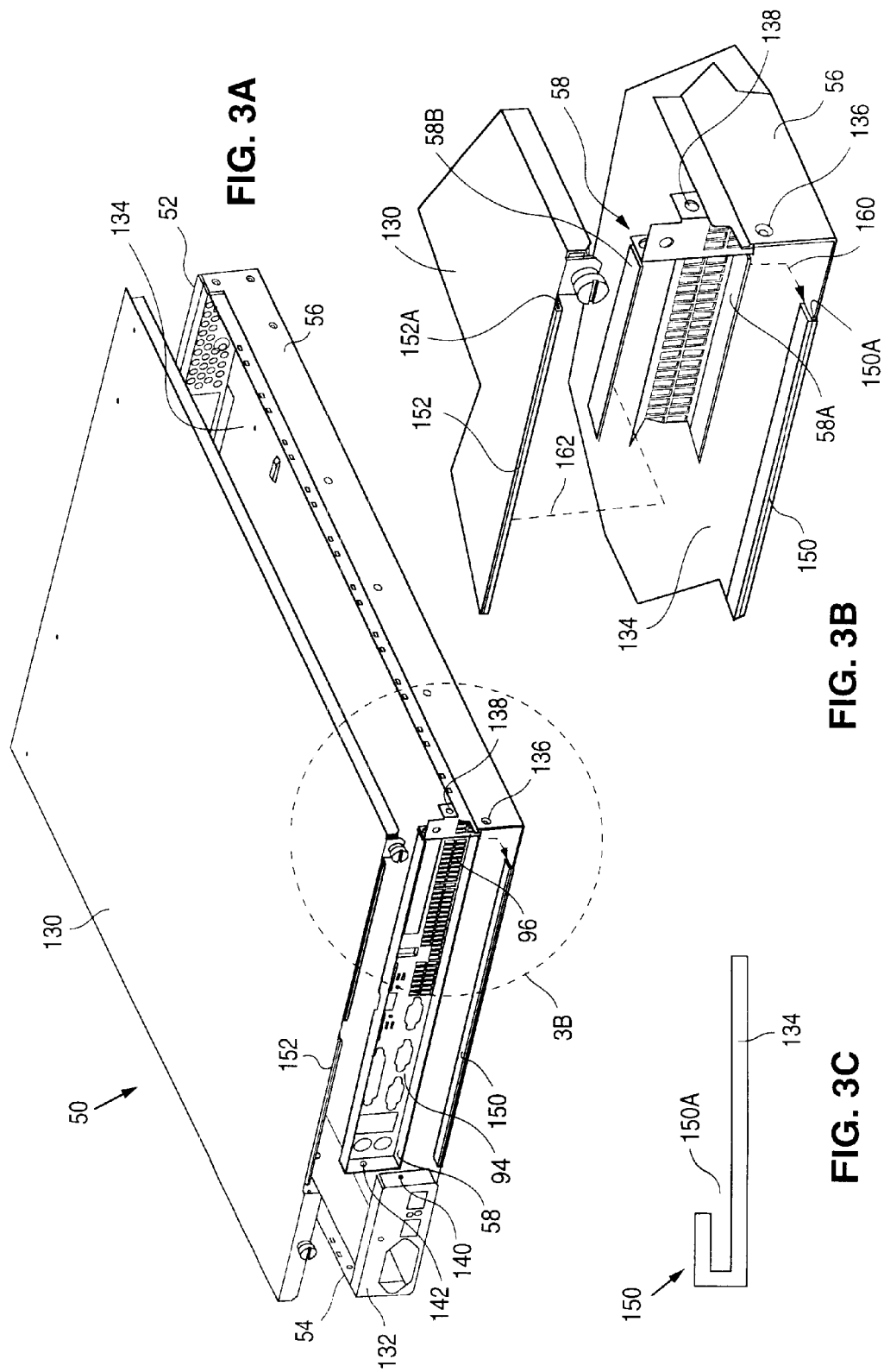

LOW PROFILE HIGH DENSITY RACK MOUNTABLE ENCLOSURE WITH SUPERIOR COOLING AND HIGHLY ACCESSIBLE RE-CONFIGURABLE COMPONENTS

BACKGROUND

1. Field of the Invention

This invention relates to computer systems, and more specifically, the design and layout of components of computer systems.

2. Related Art

With the growth of computing applications, there has been an associated increase in the need for servers and larger scale computer systems. These server systems include such components as CPUs, hard drives, CD-ROMs, DVDs, tape backup systems, peripheral cards, monitors, and universal power supplies.

Network server components can be mounted vertically on a server rack or cabinet in a dedicated server location, often with temperature, humidity, and particle controls. Using such racks, server components can be stored with high space efficiency, while allowing easy visual and manual access. Server racks and cabinets have standard size mounting holes to which computer equipment can be attached. Rack-mounted equipment are typically provided in unit or "U" sizes. A typical 1 unit ("1U" ) server measures 1.75" high, 19.00" wide, and 24.00" deep. An advantage of a 1U server is that its low profile allows a larger number of devices to be mounted on a given rack. For example, forty-two (42) 1U servers can be mounted in a single 7-foot rack. However, low profile servers such as 1U servers have some disadvantages.

One disadvantage is that cooling the various components mounted inside the low profile servers becomes more difficult. As mentioned above, a 1U server is only 1.75" high. This makes it difficult to circulate air throughout the system and cool the components mounted inside the server such as disk drives and CPU(s). With respect to the CPUs in the system, the cooling problem is compounded since heat sinks that include a dedicated fan cannot be mounted to the CPUs. This is because heat sinks with dedicated fans are too tall to fit inside the 1.75" chassis.

Another disadvantage is that components such as tape drives are difficult to mount inside the low profile 1U chassis. These components often require the use of multiple screws and/or other fasteners to secure the components within the chassis. This makes installation and removal of the components difficult. Further, the screws and fasteners are often dropped or lost within a chassis increasing the possibility of an electrical short. Finally, the components are generally mass produced and include multiple mounting holes into which screws are inserted to secure the components to the chassis. But, since the components are mass produced, hole location tolerances are often exceeded making it difficult or impossible to fasten a screw into each mounting hole.

Yet another disadvantage is that conventional chassis in 1U systems, and in particular the rear panels of the chassis, are designed to accommodate a single type of motherboard or printed circuit board (PCB). In other words, the rear panels cannot easily be changed so that the chassis can accommodate multiple types of motherboards. Further, conventional systems that do allow for changing of the rear panels do so by compromising the structural integrity of the chassis. That is, the chassis may sag and place pressure on other servers located beneath the sagging chassis.

Accordingly, a computer system that overcomes the disadvantages mentioned above is needed.

SUMMARY OF THE INVENTION

A low profile high density rack mountable enclosure with superior cooling and highly accessible re-configurable components is disclosed.

One embodiment of the present invention discloses a computer system comprising a chassis for holding a plurality of computer components, a CPU having a heatsink mounted thereon, wherein the CPU is mounted in the chassis, and a first blower having an inlet for receiving air and an outlet for expelling air, wherein the first blower is mounted in the chassis proximate to the CPU.

Another embodiment of the present invention discloses a retention clip for use in a computer system, the retention clip comprising a base portion having at least one tab, and a flange portion having at least one mounting hole, wherein the flange portion is connected to the base portion, and wherein the flange portion makes an angle with the base portion.

Another embodiment of the present invention discloses a computer enclosure comprising a chassis having a left side, a right side, and a bottom side, wherein a rear edge of the bottom side includes an open hem, a top panel, wherein a rear edge of the top panel includes an open hem, and a rear panel having a left side, a right side, a top side, and a bottom side, wherein the open hem of the bottom side is adapted to receive the bottom side of the rear panel, and the open hem of the top panel is adapted to receive the top side of the rear panel.

BRIEF DESCRIPTION OF THE FIGURES

For a more complete understanding of the present invention and for further features and advantages, reference is now made to the following description taken in conjunction with the accompanying drawings, in which:

FIG. 3A illustrates the server of FIG. 1A, and in particular, the design of an interchangeable rear panel in accordance with one embodiment of the present invention.

FIG. 3B illustrates a close up view of the left rear corner of the server and the interchangeable rear panel of FIG. 3A.

FIG. 3C illustrates a cross-sectional side view an open hem.

DETAILED DESCRIPTION

Figure 1:
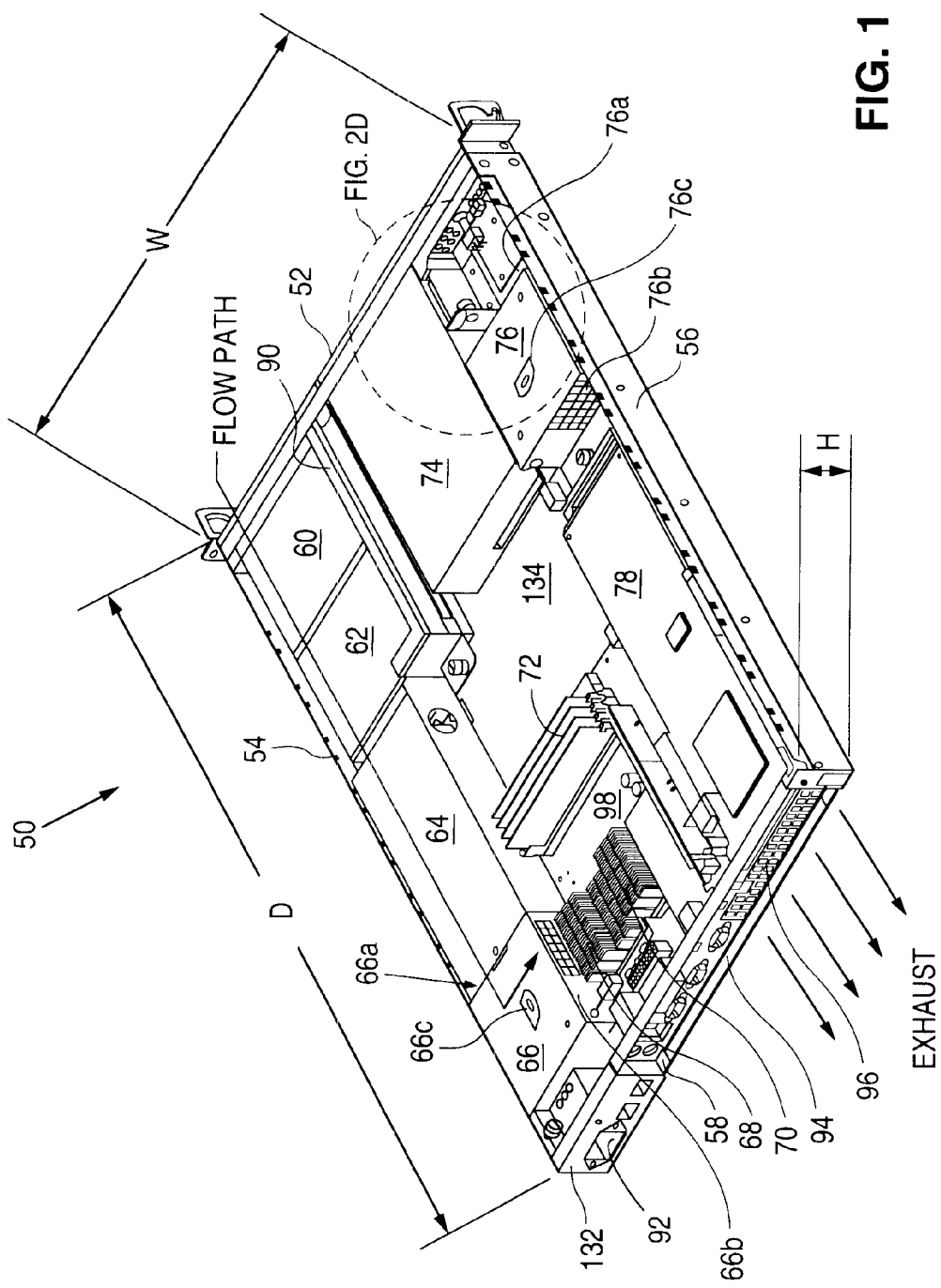
FIG. 1 shows a server in accordance with one embodiment of the present invention.

The preferred embodiments of the present invention and their advantages are best understood by referring to FIGS. 1 through 3 of the drawings. Like numerals are used for like and corresponding parts of the various drawings.

FIG. 1 shows a low profile server 50 having multiple components installed therein. For clarity, many of the components shown in FIG. 1 include only simplistic detail, and many of the connections between the various components have been omitted. Server 50 is illustrated with its top panel 130 (shown in FIGS. 3A and 3B) removed. Top panel 130, however, will generally be mounted to the top of server 50 before server 50 is installed in a server rack. Server 50 includes a unitary chassis having a front side 52, a right side 54, a left side 56, a partial rear side 132, and a bottom panel 134 (partially shown) opposite top panel 130. An interchangeable rear panel 58 is shown mounted to the unitary chassis. In the embodiment illustrated, server 50 has a width W of 17.3", a depth D of 24", and a standard 1U height H of 1.75". Interchangeable rear panel 58 includes an exhaust vent 96 and a plurality of input/output ports 94, which may include serial ports, a console adapter for a keyboard, mouse and/or video, a PCI slot, a PCI expansion slot, an RJ45 Ethernet port, a USB port, etc. A power jack 92 is mounted in partial rear side 132.

Server 50 includes two hard drives 60 and 62 located in the front right portion of server 50's chassis. Hard drives 60 and 62 are shown in FIG. 1 as a featureless boxes, but in actuality include various surface features. Hard drives 60 and 62 typically include a sealed aluminum case with an electronic circuit board attached on the bottom. An interface connector (not shown) is provided on the rear portion of hard drives 60 and 62, and include pins which mate with an interface provided in a hard drive bay (not shown). The height of hard drives 60 and 62 is less than the height H of server 50, that is, less than 1.75". In the illustrated embodiment, hard drives 60 and 62 are 14l in height and are conventionally mounted between a mounting assembly 90 and right side 54 such that 0.375" of open space is left between the bottom of hard drives 60 and 62 and bottom panel 134, and 0.375" of open space is left between the top of hard drives 60 and 62 and top panel 130. The open space above and below hard drives 60 and 62 allows ambient air to flow through a mesh or grille (not shown) on the right portion of front side 52 across hard drives 60 and 62 toward the rear portion of server 50. The flow of air across the top and bottom surfaces of hard drives 60 and 62 cools the hard drives.

Located behind hard drive 62 is power supply 64. Power supply 64 is coupled to and provides power to the electrical components in server 50. Power supply 64 is also electrically coupled to power jack 92 located in partial rear side 132.

Located behind power supply 64 is a high velocity blower 66. Blower 66 provides for circulation of and thus cooling of the components within server 50. Blower 66 may be any type of high velocity blower. Such blowers are often referred to as radial blowers, DC blowers, or centrifugal blowers and have exhaust velocities of ranging from approximately 800–1400 linear feet per minute. In one embodiment, blower 66 is integrated into power supply 64, but blower 66 can be an independent component. Blower 66 receives air through an inlet vent (not shown) located on the front side 66a of blower 66. The air is then redirected approximately 90 degrees and accelerated by an impeller located within blower 66. The redirected air then exits through an outlet located on the left side 66b of blower 66. The exhaust exits left side 66b of blower 66 at a very high velocity. The movement of air from the front of server 50 into and out of blower 66 is illustrated by the line labeled "FLOW PATH"

in FIG. 1. Blower 66 also includes tab 66c. In one embodiment, tab 66c is made from a very thin (approximately 0.015" thick) piece of die cut plastic. Tab 66c can also be made from other materials such as spring steel. Tab 66c is resiliently mounted to blower 66. In other words, tab 66c can be folded down so that it is flat with the top surface of blower 66, for example, when top panel 130 is installed onto server 50. When top panel 130 is removed from server 50, tab 66c flips up. From this position, tab 66c and be grasped by a user and thus blower 66 can be removed from server 50. In the embodiment illustrated, blower 66 is held captive within server 50 by top panel 130. Thus tab 66c is very thin, yet strong enough to allow a user to remove blower 66 from server 50.

Located next to blower 66, and in particular, next to the exhaust outlet located on left side 66b of blower 66, are two CPUs 68 and 70 having passive heat sinks mounted thereon. CPUs 68 and 70 are mounted to a conventional motherboard 98. CPUs can be any type of conventional microprocessors such as an Intel Pentium processors. The passive heat sinks mounted on CPUs 68 and 70 include a plurality of conductive heat dissipating prongs that extend away from the CPUs. The air exiting left side 66b of blower 66 flows through and across the heat dissipating prongs thereby cooling CPUs 68 and 70. The air then exits the chassis through exhaust vent 96.

It is important to note that, as mentioned above, conventional server designs included CPUs having heat sinks with fans integrated into the heat sinks. But in conventional low profile server designs, it is very difficult and often impossible to accommodate the height of such CPUs having heat sinks with fans integrated into the heat sinks. Consequently, it was very difficult to adequately cool CPUs in low profile servers. This could lead to impaired performance or complete failure of the CPUs.

One advantage of the present invention is that the exhaust outlet of a high velocity blower 66 in placed in close proximity to CPUs 68 and 70. The exhaust of blower 66 is ducted directly across the passive heat sinks mounted on CPUs 68 and 70. Since the exhaust of blower 66 is exiting at a high velocity (i.e., approximately 800–1400 linear feet per second), a high convection coefficient is achieved across the passive heat sinks. This convection coefficient is much higher than that which could be achieved using conventional fans used in 1U servers such as 40 mm×40 mm×25 mm fans which produce an exhaust velocities of approximately 200–400 linear feet per second. Thus CPUs 68 and 70 can be adequately cooled in a low profile chassis.

Another advantage of the present invention is that it allows CPUs 68 and 70 to remain near rear panel 58 of server 50. By allowing CPUs 68 and 70 to remain near the rear of the chassis and thus the rear of the motherboard, a server can conform to the well-known ATX specification.

Four conventional memory cards 72 are mounted to motherboard 98. Motherboard 98 contains electrical traces that electrically couple memory cards 72 to CPU's 68 and 70 which are also mounted to motherboard 98. Memory cards 72 can include a wide variety of memory devices such as static ram (SRAM) or dynamic ram (DRAM).

Expansion component 78 is located adjacent to motherboard 98. Expansion component can be a PCI card, a network interface card, a SCSI card, etc.

Located in front of expansion component 78 is a high velocity blower 76. Blower 76 can be the same type or a similar type of blower as blower 66 described above. Blower 76 provides for circulation of air and thus cooling of the components within server 50. Blower 76 receives air through an inlet vent (not shown) located on the front side 76a of blower 76. The air is then accelerated by a impeller located within blower 76 and exits through an outlet located on the rear side 76b of blower 76. The exhaust exits rear side 76b of blower 76 at a very high velocity, travels through expansion component 78, and then exits server 50 through exhaust vent 96 of interchangeable rear panel 58. Blower 76 also includes tab 76c which is similar to tab 66c discussed above.

Device 74 is located adjacent to front panel 52 so that device 74 can be accessed by a user without having to remove server 50 from the server rack (not shown). For example, if device 74 is a CD ROM, a disk can be installed and removed without having to remove server 50 from the server rack to which it is mounted. In addition to being a CD ROM, device 74 can be a variety of different components such as a digital audio tape (DAT) drive, a slimline combo, etc. In the embodiment illustrated, device 74 is a 5.25" CD ROM that is 1.62" in height and 5.75" wide.

Figure 2A:
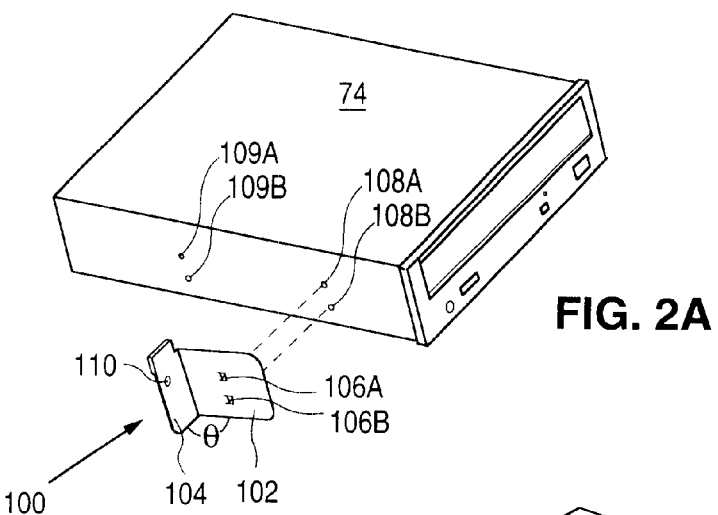
FIG. 2A shows a device and a mounting bracket before the mounting bracket is coupled to the device in accordance with one embodiment of the present invention.
Figure 2B:
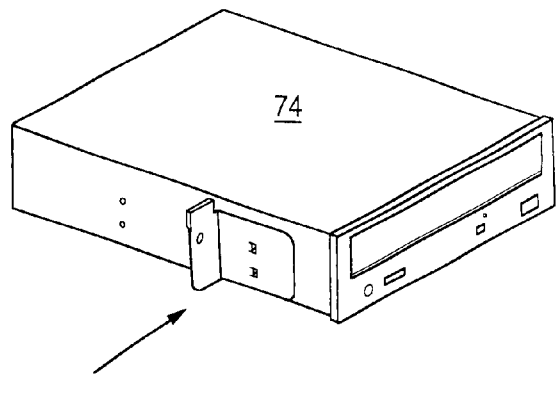
FIG. 2B shows the device and the mounting bracket of FIG. 2A after the mounting bracket has been coupled to the device in accordance with one embodiment of the present invention.

Device 74 is mounted within server 50 using a retention clip 100. FIG. 2A shows device 74 and retention clip 100 before retention clip has been mounted to device 74. Retention clip 100 includes a base portion 102 having two tabs 106A and 106B, and a flange portion 104 having a mounting hole 110. An angle θ, which is approximately 90 degrees, is formed between flange portion 104 and base portion 102. Tabs 106A and 106B can be sheet metal tabs which are formed by bending two small pieces of metal from base portion 102. To mount retention clip 100 to device 74, mounting bracket 100 is placed against the side of device 74 aligning tabs 106A and 106B with corresponding mounting holes 108A and 108B on device 74. Tabs 106A and 106B are then placed through mounting holes 106A and 106B where they lock into place. In an alternative embodiment, tabs 106A and 106B could be holes, and screws or other fasteners could placed through the holes and then fastened into mounting holes 108A and 108B using conventional tools. FIG. 2B shows device 74 after retention clip 100 has been mounted.

After retention clip 100 has been secured to device 74, device 74 can be mounted within server 50. To mount device 74 within server 50, a user first removes top panel 130 of server 50. Device 74 is then placed on the bottom panel 134 of server 50 while aligning mounting hole 110 of retention clip 100 with a mounting hole 122 of a mounting bracket 112 as shown in FIG. 2D. A thumb screw 124 is then used to secure retention clip 100 (and thus device 74) to mounting bracket 112 (and thus bottom panel 134 of the server chassis). Thumb screw 124 can then tightened by a user without the use of tools thereby securing device 74 within server 50. FIG. 1 illustrates device 74 after it has been mounted within server 50. In the embodiment illustrated, device 74 is secured within server 50 entirely by retention clip 100. In other embodiments, device 74 can also be secured by an angle bracket/ledge which is placed between hard drives 60 and 62 and the right side of device 74. Such an angle bracket/ledge will further secure device 74 and prevent it from sliding toward hard drives 60 and 62.

Figure 2C:
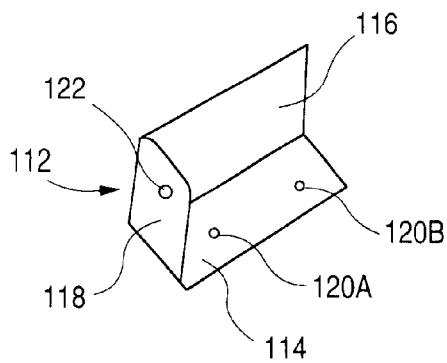
FIG. 2C shows the device and mounting bracket of FIG. 2B after it has been installed in the server of FIG. 1 in accordance with one embodiment of the present invention.
Figure 2D:
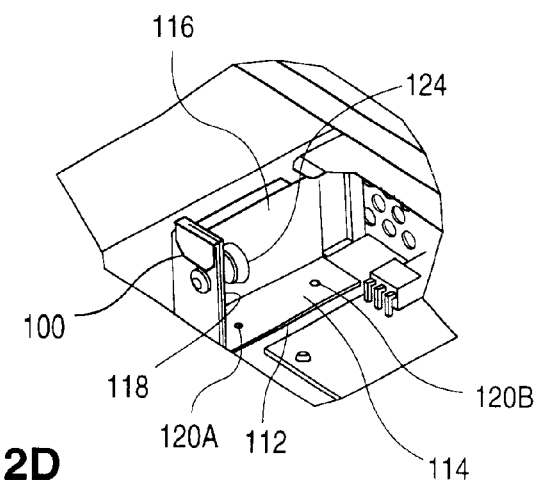
FIG. 2D shows the device and mounting bracket with hole and screw.

FIG. 2C shows mounting bracket 112 is greater detail. Mounting bracket 112 includes a base portion 114 having two mounting holes 120A and 120B, a first flange 116, and a second flange 118 having a mounting hole 122. Mounting bracket 112 is secured to the bottom panel 134 of server 50 by placing screws or other fasteners (not shown) through mounting holes 120A and 120B and then fastening the screws or other fasteners into corresponding mounting holes (not shown) in the bottom panel 134 of server 50. Mounting bracket 112 can also be mounted to the bottom panel 134 of server 50 by a spotweld. Mounting bracket 112 is typically secured to the bottom panel 134 of server 50 before device 74 is secured to mounting bracket 112.

It is important to note that, in conventional server designs, devices such as device 74 were mounted using the eight mounting holes provided on the two sides of device 74 (i.e., mounting holes 108A, 108B, 109A, and 109B and four similar mounting holes (not shown) located on the right side of device 74). This made the installation and removal of such devices very difficult. For example, if device 74 of FIG. 1 needed to be removed from server 50, hard drives 60 and 62 and blower 76 would have to be removed first so that a user could access the four screws on the left side of device 74 and the four screws on the right side of device 74. This process is extremely time consuming and cumbersome and could potentially lead to damage of hard drives 60 and 62 or other components due to excessive handling.

One advantage of the present invention is that retention clip 100 (and thus device 74) can be mounted to server 50 using a single thumb screw 124 providing for easy installation an removal of device 74. Thumb screw 124 can be tightened by a user without the use of tools. This allows a user to install or remove device 74 very easily. Neither hard drives 60 and 62, blower 74, nor any other components that may be close to device 74 need to be removed to install or remove device 74.

FIG. 3A illustrates server 50, and in particular, the design of interchangeable rear panel 58. For clarity, the components typically residing in server 50 are not shown in FIG. 3A. As described above, server 50 includes a unitary chassis having front side 52, right side 54, left side 56, partial rear side 132, and bottom side 134 (partially shown) opposite top panel 130. Server 50 also includes interchangeable rear panel 58 which can be mounted to the unitary chassis.

Interchangeable rear panel 58 includes exhaust vent 96 and a plurality of input/output ports 94, which may include serial ports, a console adapter for a keyboard, mouse and/or video, a PCI slot, a PCI expansion slot, an RJ45 Ethernet port, a USB port, etc. Partial rear side 132 includes a hole for receiving power jack 92 (FIG. 1). Partial rear side 132 also includes a mounting hole 140 which aligns with a corresponding mounting hole 142 on rear panel 58. Left side 56 includes a mounting hole 136 which aligns with a corresponding mounting hole 138 on rear panel 58. Bottom side 134 includes an open hem 150. Top panel 130 includes an open hem 152.

FIG. 3B shows a close up view of the left rear corner of server 50 and rear panel 58. Open hems 150 and 152 include openings 150A and 152A. Openings 150A and 152A are adapted to receive bottom side 58A and top side 58B, respectively, of rear panel 58. FIG. 3C shows a cross-sectional side view of open hem 150 and opening 150A.

Rear panel 58 can be installed into server 50 as follows. Rear panel 58 is placed against bottom side 150 approximately one inch away from open hem 150. Rear panel is then slid toward open hem 150 as indicated by arrow 160. Bottom side 58A of rear panel then slides into opening 150A of open hem 150 and is held in place by frictional forces created by the coupling of open hem 150 and bottom side 58A. Top panel 130 is installed in a similar manner as indicated by arrow 162. Top side 58B of rear panel is held in place by frictional forces created by the coupling of open hem 152 and top side 58B.

The frictional forces created between open hem 150 and bottom side 58A of rear panel and open hem 152 and top side 58B of rear panel are strong enough to secure rear panel in server 50. However, mounting holes 138 and 142 are provided on each side of rear panel 58 to further secure rear panel in server 50. Mounting hole 138 aligns with mounting hole 136 of left side 56 and mounting hole 142 aligns with mounting hole 140 of partial rear side 132. Screws or other fasteners can then placed through and tightened in these mounting holes to further secure rear panel 58 to the server's chassis.

One advantage of the present invention, and in particular the open hem design described with reference to FIGS. 3A–3C, is its structural integrity. Those skilled in the art will recognize that the coupling of open hem 150, which is integrally connected with the bottom side 134 of the server, with bottom side 58A of the rear panel creates a unitary structural member that is very stiff. Likewise, the coupling of open hem 152 with top side 58B of the rear panel creates a unitary structural member that is very stiff. Another advantage of the present invention that it allows for the rear panel to be changed relatively easily, while maintaining structural integrity of the chassis. This is advantageous since it allows multiple motherboards (which can be attached to the rear panel) to be used with a single chassis. Further, interchangeable rear panels are relatively inexpensive to design and manufacture. Thus, a custom server can be designed quickly and inexpensively while maintaining the structural integrity of the server chassis.

Yet another advantage of the present invention is that the mating of the open hem of the bottom side of the chassis with the bottom side of the rear panel, and the mating of the open hem of the top panel with the top side of the rear panel provides for a strong electromagnetic radiation shield. This is especially important as the speeds of CPUs increase and generate more electromagnetic energy which can radiate out of the server and interfere with neighboring servers.

While particular embodiments have been shown and described, it will be obvious to those skilled in the art that various changes and modifications may be made without departing from this invention in its broader aspects and therefore the appended claims encompass all such changes and modifications as fall within the true spirit and scope of this invention.

What is claimed is:

1. A computer system comprising:
    a chassis for holding a plurality of computer components;
    a CPU having a heatsink mounted thereon, wherein the CPU is mounted in the chassis; and
    a first blower having an inlet for receiving air and an outlet for expelling air, wherein the first blower is mounted in the chassis proximate to the CPU;
    wherein the chassis is configured to mount in a server rack.

2. The computer system of claim 1 wherein the chassis is a low profile chassis.

3. The computer system of claim 1 wherein the heatsink is a passive heatsink.

4. The computer system of claim 1 wherein the first blower is a centrifugal blower.

5. The computer system of claim 1 further comprising a power supply, wherein first blower is integrated into the power supply.

6. The computer system of claim 1 wherein the air enters the first blower through the inlet, is redirected approximately 90 degrees, and then exits the first blower through the outlet.

7. The computer system of claim 1 further comprising one or more hard drives, the hard drives mounted near a front side of the chassis, the front side of the chassis near the hard drives having an inlet for allowing air to enter the chassis, wherein the first blower draws air through the inlet over a surface of the hard drive causing the hard drive to be cooled.

8. The computer system of claim 1 wherein the first blower further comprises a resilient tab, the resilient tab for allowing a user to remove the first blower from the computer system.

9. The computer system of claim 1 further comprising a second blower.

10. The computer system of claim 2 wherein the chassis is approximately 1.75" in height.

11. The computer system of claim 9 wherein the second blower is a centrifugal blower.

12. The computer system of claim 9 wherein the second blower further comprises a resilient tab, the resilient tab for allowing a user to remove the second blower from the computer system.

13. A computer enclosure comprising:
    a chassis having a left side, a right side, and a bottom side, wherein a rear edge of the bottom side includes an open hem;
    a top panel, wherein a rear edge of the top panel includes an open hem; and
    an interchangeable rear panel having a left side, a right side, a top side, and a bottom side, wherein the open hem of the bottom side is adapted to receive the bottom side of the rear panel, and the open hem of the top panel is adapted to receive the top side of the rear panel.

14. The computer enclosure of claim 13 wherein the rear panel is adapted to receive a motherboard.

15. The computer enclosure of claim 13 further comprising a partial rear side.

16. The computer enclosure of claim 13 wherein frictional forces between the open hem of the bottom side and the bottom side of the rear panel, and frictional forces between the open hem of the top panel and the top side of the rear panel secure the rear panel to the chassis.

17. The computer enclosure of claim 14 wherein the rear panel includes an exhaust vent.

18. The computer enclosure of claim 15 wherein the partial rear side has a mounting hole corresponding to a mounting hole on the right side of the rear panel.

19. The computer enclosure of claim 15 wherein the left side of the chassis has a mounting hole corresponding to a mounting hole on the left side of the rear panel.

20. A computer system comprising:
    a chassis;
    a motherboard having a top surface and a bottom surface;
    a CPU having a first side, a top surface, and a bottom surface, the bottom surface of the CPU mechanically coupled to the top surface of the motherboard;
    a heatsink having a bottom surface, the bottom surface of the heatsink mechanically coupled to the top surface of the CPU; and
    a first blower having a first side, a second side, a top surface, and a bottom surface, the bottom surface of the first blower mechanically coupled to the chassis, the first side of the first blower having an inlet for receiving air, the second side of the first blower having an outlet for expelling air;
    wherein the outlet of the first blower expels air toward the first side of the CPU and the heatsink causing the CPU to be cooled.

21. The computer system of claim 20 wherein the chassis is a low profile chassis.

22. The computer system of claim 20 wherein the heatsink is a passive heatsink.

23. The computer system of claim 20 wherein the first blower is a centrifugal blower.

24. The computer system of claim 20 further comprising a power supply, wherein first blower is integrated into the power supply.

25. The computer system of claim 20 wherein the air enters the first blower through the inlet, is redirected approximately 90 degrees, and then exits the first blower through the outlet.

26. The computer system of claim 20 further comprising one or more hard drives, the hard drives mounted near a front side of the chassis, the front side of the chassis near the hard drives having an inlet for allowing air to enter the chassis, wherein the first blower draws air through the inlet over a surface of the hard drive causing the hard drive to be cooled.

27. The computer system of claim 20 wherein the first blower further comprises a resilient tab, the resilient tab for allowing a user to remove the first blower from the computer system.

28. The computer system of claim 20 further comprising a second blower.

29. The computer system of claim 21 wherein the chassis is approximately 1.75" in height.

30. The computer system of claim 28 wherein the second blower is a centrifugal blower.

31. The computer system of claim 28 wherein the second blower further comprises a resilient tab, the resilient tab for allowing a user to remove the second blower from the computer system.

* * * * *